United States Patent [19]
McGillan

[11] Patent Number: 5,969,561
[45] Date of Patent: Oct. 19, 1999

[54] INTEGRATED CIRCUIT HAVING A VARIABLE RF RESISTOR

[75] Inventor: Michael E. McGillan, Mountain View, Calif.

[73] Assignee: Diablo Research Company, LLC, Sunnyvale, Calif.

[21] Appl. No.: 09/035,368

[22] Filed: Mar. 5, 1998

[51] Int. Cl.[6] .................................................. H03K 5/08
[52] U.S. Cl. ........................ 327/308; 327/493; 327/583
[58] Field of Search .................................. 327/308, 493, 327/503, 504, 583, 586, 574, 419, 478

[56] References Cited

U.S. PATENT DOCUMENTS

| | | | |
|---|---|---|---|
| 4,196,440 | 4/1980 | Anantha et al. | 357/35 |
| 4,275,362 | 6/1981 | Harford | 330/283 |
| 4,412,239 | 10/1983 | Iwasaki et al. | 357/44 |
| 4,549,196 | 10/1985 | Kub | 357/35 |
| 4,583,106 | 4/1986 | Anantha et al. | 357/35 |
| 4,743,565 | 5/1988 | Goth et al. | 437/32 |
| 4,882,504 | 11/1989 | Petitjean et al. | 307/256 |
| 4,883,984 | 11/1989 | Kess | 307/256 |
| 4,942,375 | 7/1990 | Petitjean et al. | 333/81 R |
| 5,128,566 | 7/1992 | Killion et al. | 307/567 |
| 5,140,200 | 8/1992 | Stanton | 307/540 |
| 5,181,083 | 1/1993 | Pezzani | 257/491 |
| 5,237,198 | 8/1993 | Lee | 257/557 |
| 5,343,070 | 8/1994 | Goodrich et al. | 257/594 |
| 5,347,156 | 9/1994 | Sakaue | 257/575 |
| 5,351,013 | 9/1994 | Alidio et al. | 320/284 |
| 5,401,999 | 3/1995 | Bayraktaroglu | 257/458 |
| 5,485,033 | 1/1996 | Leduc | 257/578 |
| 5,493,133 | 2/1996 | Duvvury et al. | 257/111 |
| 5,519,247 | 5/1996 | Arbus et al. | 257/437 |

*Primary Examiner*—Jeffrey Zweizig
*Attorney, Agent, or Firm*—David R. Gildea

[57] ABSTRACT

A bipolar radio frequency (RF) integrated circuit having a functional equivalent of a PIN diode. The RF integrated circuit includes a low frequency lateral PNP transistor having an emitter having a P+ region, a collector having a P+ region, a base having an N+ region and an N region having a current dependent stored charge having a relatively low level when no current is flowing between the emitter and a junction connecting the base and collector. An RF resistance between the emitter and the junction is controlled by a bias applied from the emitter to the junction. By varying the bias, the low frequency lateral PNP transistor from the emitter to the junction is used as a variable RF resistor or as an RF signal carrying component in a variable attenuator or RF switch.

12 Claims, 7 Drawing Sheets

INTEGRATED CIRCUIT HAVING A VARIABLE RF RESISTOR

BACKGROUND OF THE INVENTION

1. Field of the Invention

The invention relates generally to bipolar radio frequency (RF) integrated circuits having high frequency vertical NPN transistors and low frequency lateral PNP transistors and more particularly to an RF integrated circuit using a lateral PNP transistor as a variable resistor or as an RF signal carrying component in a variable attenuator or RF switch.

2. Description of the Prior Art

Discrete radio frequency (RF) circuits commonly use PIN diodes as variable resistors for signal path switching and controlled signal attenuation. A PIN diode, illustrated in FIG. 1b, has a P+ region having a high density of positive carriers, an N+ region having a high density of negative carriers, and an I region of intrinsic material having a low intrinsic carrier density disposed between the P+ and N+ regions. An electrical charge is stored in the I-region that is proportional the volume of the I-region and the carrier density. The separation of the N+ and P+ regions by the I region causes the PIN diode to have a favorable characteristic for RF circuits of having a relatively low capacitance. In operation an external bias voltage and current is applied to the PIN diode through electrical connections to the P+ and N+ regions. When a positive voltage (forward bias) is applied, a forward bias current having an exponential relationship to the voltage passes through the I region. The stored charge due to the carriers in the I-region is proportional to this bias current. Importantly, the PIN diode has an effective RF resistance that decreases as the stored charge increases, with the result that the PIN diode becomes a variable RF resistor having a resistance that depends upon the forward bias current. Typically, a relatively low bias current of a few milliamps is required to store enough charge to reach an RF resistance of a few ohms. For frequencies higher than a few tens of megahertz, a relatively large RF signal applied across the forward biased PIN diode does not significantly add or subtract to the stored charge in the I region at the peaks of the signal, and therefore distortion of the RF signal is low. When a negative voltage potential (reverse bias) is applied from the P+ region to the N+ region a very small reverse current passes through the I region causing the PIN diode to have a high RF resistance.

Existing silicon bipolar RF integrated circuits use a set of standard components that are characterized for the processes of designing and manufacturing the integrated circuit. These components typically include fixed resistors, capacitors, PN diodes, high frequency NPN transistors that are diffused vertically into a certain area of a silicon substrate, and low frequency PNP transistors using separate horizontally spaced (lateral) diffused areas of the substrate. The lateral PNP transistors have a much lower frequency response than the NPN transistors so they are not generally used as RF signal carrying components in RF circuits within the integrated circuit but are nevertheless included for convenience in designing low frequency circuitry. A great deal of engineering and testing goes into characterizing the standard components and designing the manufacturing and design processes so that the components are as predictable as possible. It should be appreciated that deviating from the set of standard components is prohibitively expensive in both design and manufacturing and may yield unpredictable results. Therefore when cost is any consideration, it is important for the RF engineer to adapt his custom design to the standard components rather than vice versa. Because PIN diodes are not included in the set of standard components, RF engineers have used PN diodes as variable resistance elements in RF integrated circuits. However, as compared to a PIN diode a PN diode, illustrated in FIG. 1a, exhibits less desirable characteristics of having greater distortion and a higher capacitance and of requiring a greater bias current for operation.

There is a need for an RF integrated circuit having a variable RF resistor having a low capacitance, low distortion, and low operating current using the set of standard components that are characterized for the processes of designing and manufacturing the integrated circuit.

SUMMARY OF THE INVENTION

It is therefore an object of the present invention to provide an RF integrated circuit using a standard low frequency lateral PNP transistor as a variable RF resistor having a low capacitance, low distortion, and low bias current.

Another object is to provide an RF switch and a method in an RF integrated circuit using a low frequency lateral PNP transistor as an RF signal carrying component for switching an RF signal.

Another object is to provide a variable attenuator and a method in an RF integrated circuit using a low frequency lateral PNP transistor as an RF signal carrying component for attenuating an RF signal.

Briefly, the present invention uses a silicon bipolar RF integrated circuit that includes as standard components low frequency lateral PNP transistors, high frequency vertical NPN transistors, resistors, capacitors, and means for connection. Each lateral PNP transistor includes an emitter having a P+ region having a high density of positive carriers, a collector having a P+ region having a high density of positive carriers, and a base having an N+ region having a high density of negative carriers and an N region. When no current is flowing between the collector and the emitter or the base and the emitter, the N region has a negative carrier density that is low compared to the carrier densities of the P+ and N+ regions. A forward current flowing through the N region injects additional carriers resulting in a stored charge in the N region. Having a relatively low carrier density and a current dependent stored charge, the N region of the lateral transistor functions in a similar manner to the I region of a discrete PIN diode. In a preferred embodiment, the present invention of an RF integrated circuit includes a variable RF resistor including a low frequency lateral PNP transistor. The bias circuit provides a variable forward bias current for controlling the stored charge in the N region of the lateral transistor. The resistance of the variable RF resistor is decreased or increased by increasing or decreasing, respectively, the forward bias current. In another preferred embodiment, the present invention of an RF integrated circuit includes a PI or T variable attenuator including a bias circuit for providing variable forward bias currents and low frequency lateral PNP transistors as variable resistance elements for attenuating an RF signal. In another preferred embodiment, the present invention of an RF integrated circuit includes an RF transmit/receive switch including a bias circuit for alternatively providing a forward or reverse bias and low frequency lateral PNP is transistors as RF signal carrying components for switching between a receiver input and a transmitter output to a single antenna.

An advantage of the present invention is that an RF integrated circuit includes a variable RF resistor having a low capacitance, low distortion, and low bias current.

Another advantage of the present invention is that an RF switch and a method for switching an RF signal in an RF integrated circuit uses a low frequency lateral PNP transistor as an RF signal carrying component.

Another advantage of the present invention is that an RF integrated circuit includes an attenuator using a low frequency lateral PNP transistor as an RF signal carrying component.

These and other objects and advantages of the present invention will no doubt become obvious to those of ordinary skill in the art after having read the following detailed description of the preferred embodiments which are illustrated in the various figures.

IN THE DRAWINGS

DETAILED DESCRIPTION OF THE PREFERRED EMBODIMENTS

Figure 1B:
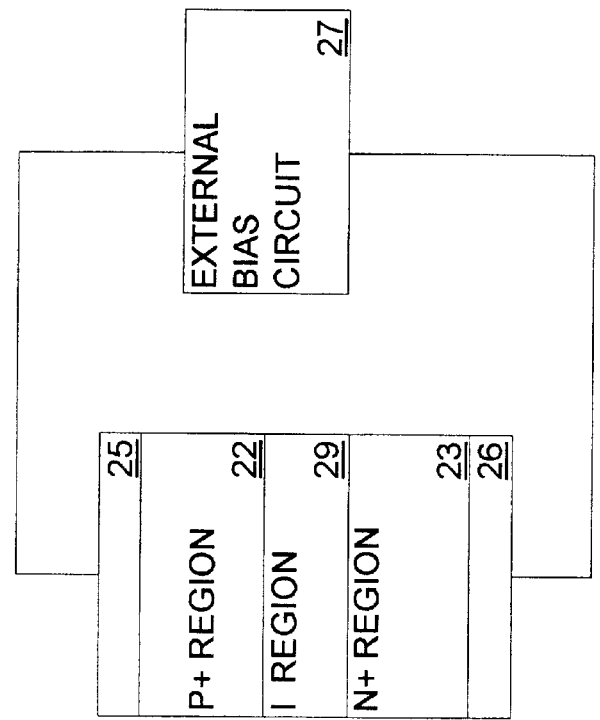
FIGS. 1a and 1b illustrate a PN diode and, a PIN diode respectively, of the prior art.
Figure 1A:
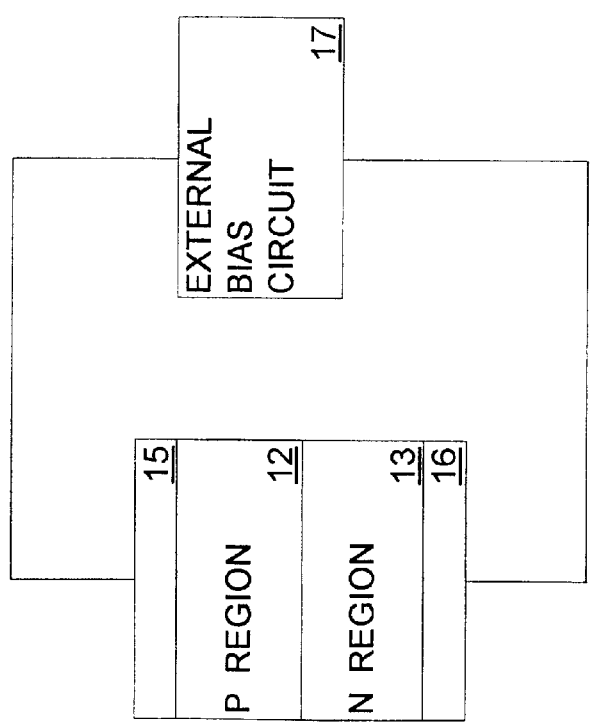

FIG. 1a is a generalized illustration of a semiconductor PN diode 10 of the prior art. The PN diode 10 has a P region 12, an N region 13, and ohmic contact pads 15 and 16. The contact pads 15 and 16 enable an external electrical bias circuit 17 and a radio frequency (RF) signal to connect to the P region 12 and the N region 13. The P region 12 and the N region 13 have been doped with impurities in order to have a high positive and a high negative carrier density, respectively. A voltage potential applied by the bias circuit 17 across the PN diode 10 causes a bias current to flow from the higher potential (positive in a relative sense) to the lower potential (negative in the relative sense). A negative potential (reverse bias) applied from the P region 12 to the N region 13 causes very little bias current to flow, whereas a positive potential (forward bias) causes the bias current to increase approximately exponentially with increasing voltage. The doping and the current flow in the P and N regions 12 and 13 cause the PN diode 10 to have an equivalent small signal resistance and small signal capacitance measured across the contact pads 15 and 16 in parallel with the bias. In the reverse bias direction the resistance is very high and the impedance of the PN diode 10 to a small RF signal having a frequency greater than about thirty megahertz is typically set by the capacitive reactance. In the forward bias direction the resistance decreases as the forward bias voltage and current increase until a small fixed resistance is reached for large forward bias. For a forward bias of greater than about zero point six volts, the resistance will typically be less than the capacitive reactance so the impedance of the PN diode 10 will be set by the resistance. A small RF signal of less than about minus twenty to minus ten dBm applied across the PN diode 10 will be loaded by the impedance set by the small signal resistance and capacitance. However, a larger RF signal will be distorted and compressed because the peaks of the RF signal change the resistance by adding and subtracting from the bias.

FIG. 1b is a general illustration of a PIN diode 20 of the prior art. The PIN diode 20 includes a P+ region 22 analogous to the P region 12 in the PN diode 10, an N+ region 23 analogous to the N region 13 in the PN diode 10, and contact pads 25 and 26 analogous to the contact pads 15 and 16 in the PN diode 10. The contact pads 25 and 26 enable an external electrical bias circuit 27 to connect to the P+ region 22 and the N+ region 23, respectively. The PIN diode 20 differs from the PN diode 10 by having an I region 29 having a low intrinsic carrier density between the P+ region 22 and the N+ region 23. One effect of the I region 29 is that the capacitance of the PIN diode 20 is lower than for the PN diode 10 because the P+ region 22 and the N+ region 23 of the PIN diode 20 are spaced further apart than the P region 12 and the N region 13 of the PN diode 10.

The PIN diode 20, in common with the PN diode 10, has a very small reverse current flow when a negative voltage is applied from the P+ region 22 to the N+ region 23 and an exponentially increasing forward current flow in response to a positive voltage. In the PIN diode 20 the forward current flow increases the carrier density in the I region 29 by inducing additional carriers. The induced carrier density in the I region 29 times the volume of the I region 29 causes the I region 29 to have a stored charge. The stored charge gives the PIN diode 20 an effective RF resistance for frequencies above about ten to one-hundred megahertz depending upon the amount of the stored charge. Importantly, the peaks of a relatively large RF signal of such frequencies applied to the PIN diode 20 do not significantly increase or decrease the stored charge in the I-region 29 and therefore the RF resistance of the PIN diode 20 does not change appreciably during the cycle of the RF signal. Consequently, the RF signal is not significantly distorted or compressed until the RF signal is much larger than the minus twenty to minus ten dBm that is distorted by the PN diode 10.

Figure 2:
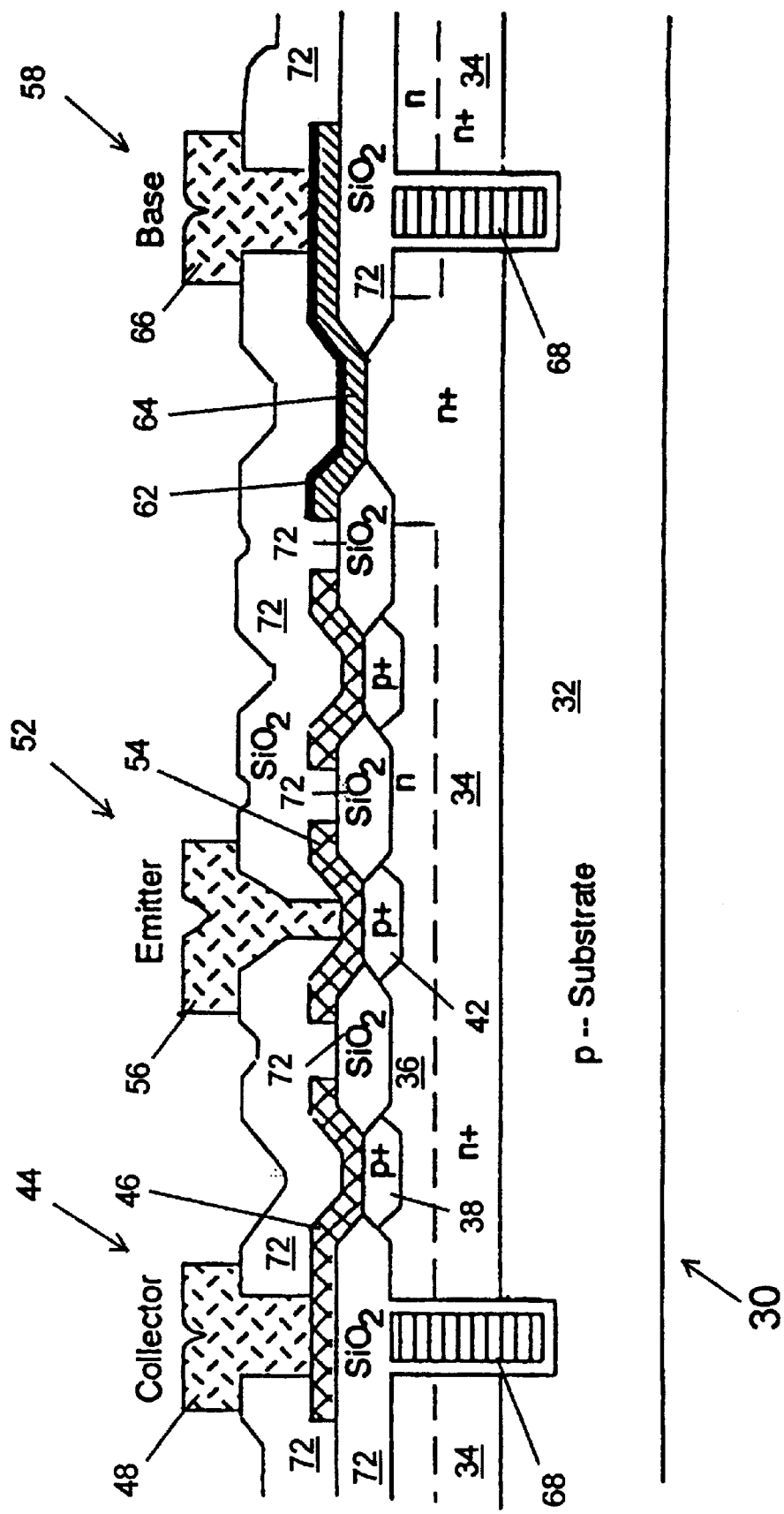
FIG. 2 illustrates cross-sectional view of a standard low frequency lateral PNP transistor in a radio frequency (RF) integrated circuit of the prior art.

FIG. 2 illustrates a lateral PNP transistor 30 of prior art using a bipolar radio frequency (RF) integrated circuit process having RF vertical NPN transistors having an $F_T$ of about 22 gigahertz at about one milliampere of emitter current and low frequency lateral PNP transistors having an $F_T$ of about 35 megahertz at one milliampere of emitter current. Such integrated circuit process is commercially available in Silicon as a Maxim GST-2 from Maxim Integrated Products of Sunnyvale, Calif. The transistor 30 has a P substrate 32; an N+ region 34 having a high negative carrier density; an N region 36 having a low level negative carrier density; a collector P+ region 38 having a high positive carrier density; an emitter P+ region 42 having a high positive carrier density; a collector connection 44 including a P+ Poly-Si layer 46 and a gold contact 48 connected to the collector P+ region 38; an emitter connection 52 including a P+ Poly-Si layer 54 and a gold contact 56 connected to the P+ region 42; a base connection 58 including a $TiSi_2$ layer 62, an N+ Poly-Si layer 64, and a gold contact 66 connected to the N+ region 34; undoped Poly-Si areas 68; and $SiO_2$ insulating layers 72. The intrinsic carrier density of the N-region 36 is low relative to the carrier densities of the N+ region 34 and the P+ regions 38 and 42. However, a forward current from the emitter connection 52 to the base connection 58 and collector connection 44 flowing through the N region 36 injects additional carriers which result in a stored charge in the N region 36.

Figure 3:
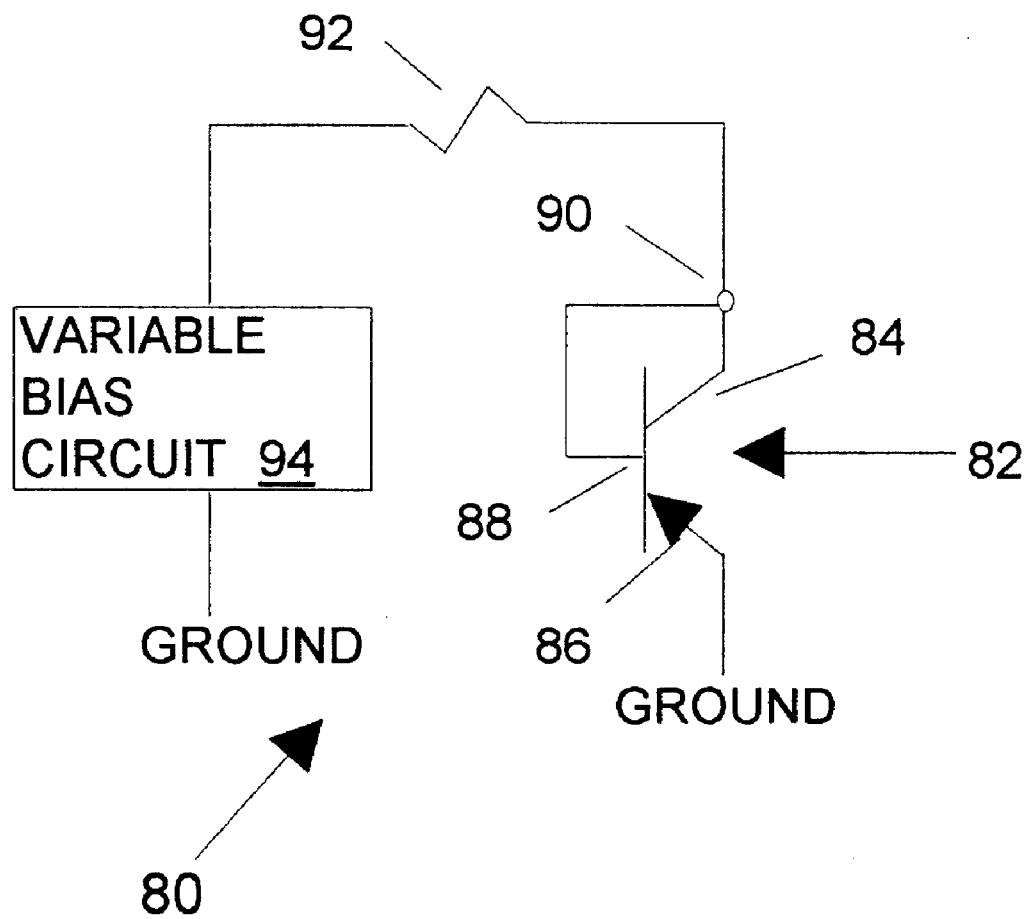
FIG. 3 is a schematic of a variable RF resistor of the present invention using the lateral PNP transistor of FIG. 2.

FIG. 3 is a schematic of a variable resistor of the present invention and referred to by the reference numeral 80. The variable resistor 80 includes a lateral transistor 82 such as the lateral transistor 30 (FIG. 2). The lateral transistor 82 includes a collector 84 having a P+ region having a high positive carrier density, an emitter 86 having a P+ region having a high positive carrier density, and a base 88 having an N+ region having a high negative carrier density and an N region such as the N-region 36 (FIG. 2) having a current dependent stored charge. The collector 84 and the base 88 are connected at a junction 90. The junction 90 connects to one end of a resistor 92. The other end of the resistor 92 connects to one end of a variable bias circuit 94. The emitter 86 connects to the other end of the bias circuit 94 through ground. A positive voltage from the bias circuit 94 causes the transistor 82 to be reverse biased resulting in very little current flow and an effective RF resistance between the emitter 86 and the junction 90 of more than a thousand ohms. A negative voltage from the bias circuit 94 causes the transistor 82 to be forward biased having a current flow into the emitter 86, through the N region, and out of the junction 90. Depending upon the level of the forward current, an effective radio frequency (RF) resistance between the junction 90 and the emitter 86 has a range of a few ohms to at least a thousand ohms. The stored charge in the N region gives the variable resistor 80 an effective RF resistance depending upon the amount of the stored charge. Importantly, for frequencies above about ten to one-hundred megahertz the peaks of a relatively large RF signal across the emitter 86 and the junction 90 do not significantly change the stored charge and therefore the RF resistance of the variable resistor 80 does not change appreciably during the cycle of the RF signal. Consequently, the RF signal is not significantly distorted or compressed. For example, a compression of about one-half dB occurs at an RF signal level of about plus six dBm applied in parallel with a forward bias current of about one to two milliamps. This combination of low capacitance, low distortion, and variable resistance in the forward bias direction make the variable resistor 80 especially useful in the designs of variable attenuators and RF switches.

Figure 4A:
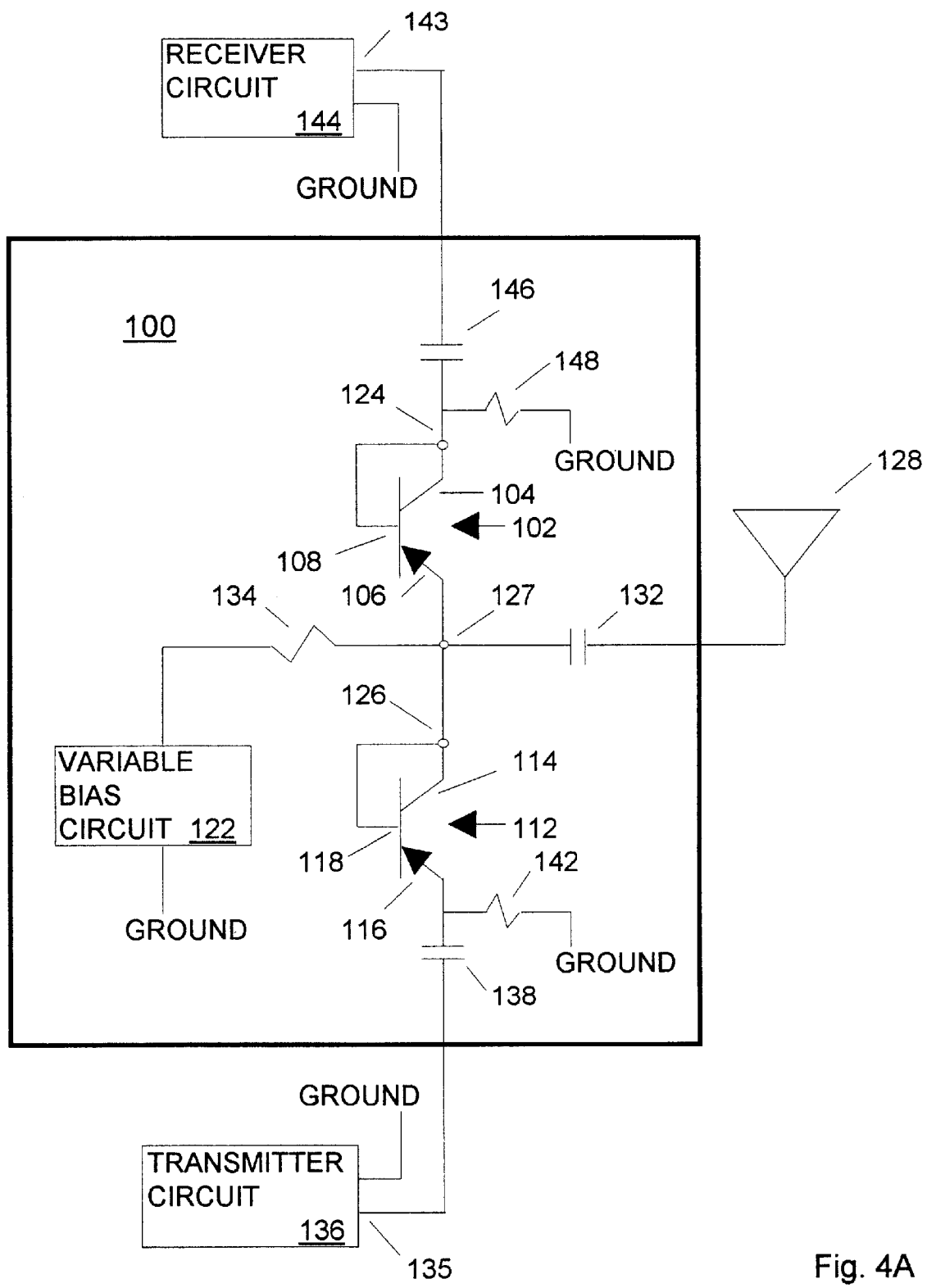
FIGS. 4a and 4b are schematic diagrams of embodiments of a transmit/receive switch of the present invention using the lateral PNP transistor of FIG. 2.

FIG. 4a is a schematic of a radio frequency (RF) transmit/ receive switch of the present invention referred to by the reference numeral 100 and using low frequency lateral PNP transistors such as the lateral PNP transistor 30 (FIG. 2). The RF switch 100 includes a first lateral PNP transistor 102 having a collector 104, an emitter 106, and a base 108; a second lateral PNP transistor 112 having a collector 114, an emitter 116, and a base 118; and a variable bias circuit 122. The collectors 104 and 114 and the emitters 106 and 116 each have a P+ region having a high positive carrier density and the bases 108 and 118 each have an N+ region having a high negative carrier density and an N region such as the N-region 36 (FIG. 2) having a current dependent stored charge.

The first and second transistors 102 and 112 are connected as diodes by connecting the collector 104 to the base 108 at a first junction 124 and the collector 114 to the base 118 at a second junction 126. The second junction 126 and the emitter 106 are connected at an output junction 127. The output junction 127 is coupled to an antenna 128 through a capacitor 132 and to an active port of the bias circuit 122 through a resistor 134. The emitter 116 connects to an active port 135 of a transmitter circuit 136 through a capacitor 138 and to ground through a resistor 142. The first junction 124 connects to an active port 143 of a receiver circuit 144 through a capacitor 146 and to ground through a resistor 148. The bias circuit 122, the transmitter circuit 136, and the receiver circuit 144 are connected to ground through ground ports. In transmit operation a negative potential from the active port of the bias circuit 122 drives a forward bias current through the second transistor 112 and reverse biases the first transistor 102, thereby providing a low impedance path for an RF transmit signal from the transmitter circuit 136 to the antenna 128 and a high impedance to isolate the receiver circuit 144 from the RF transmit signal. In receive operation a positive potential from the bias circuit 122 drives a forward bias current through the first transistor 102 and reverse biases the second transistor 112, thereby providing a low impedance path for an RF receive signal from the antenna 128 to the receiver circuit 144 and isolates the output impedance of the transmitter circuit 136 from the receiver circuit 144 and the antenna 128.

Figure 4B:
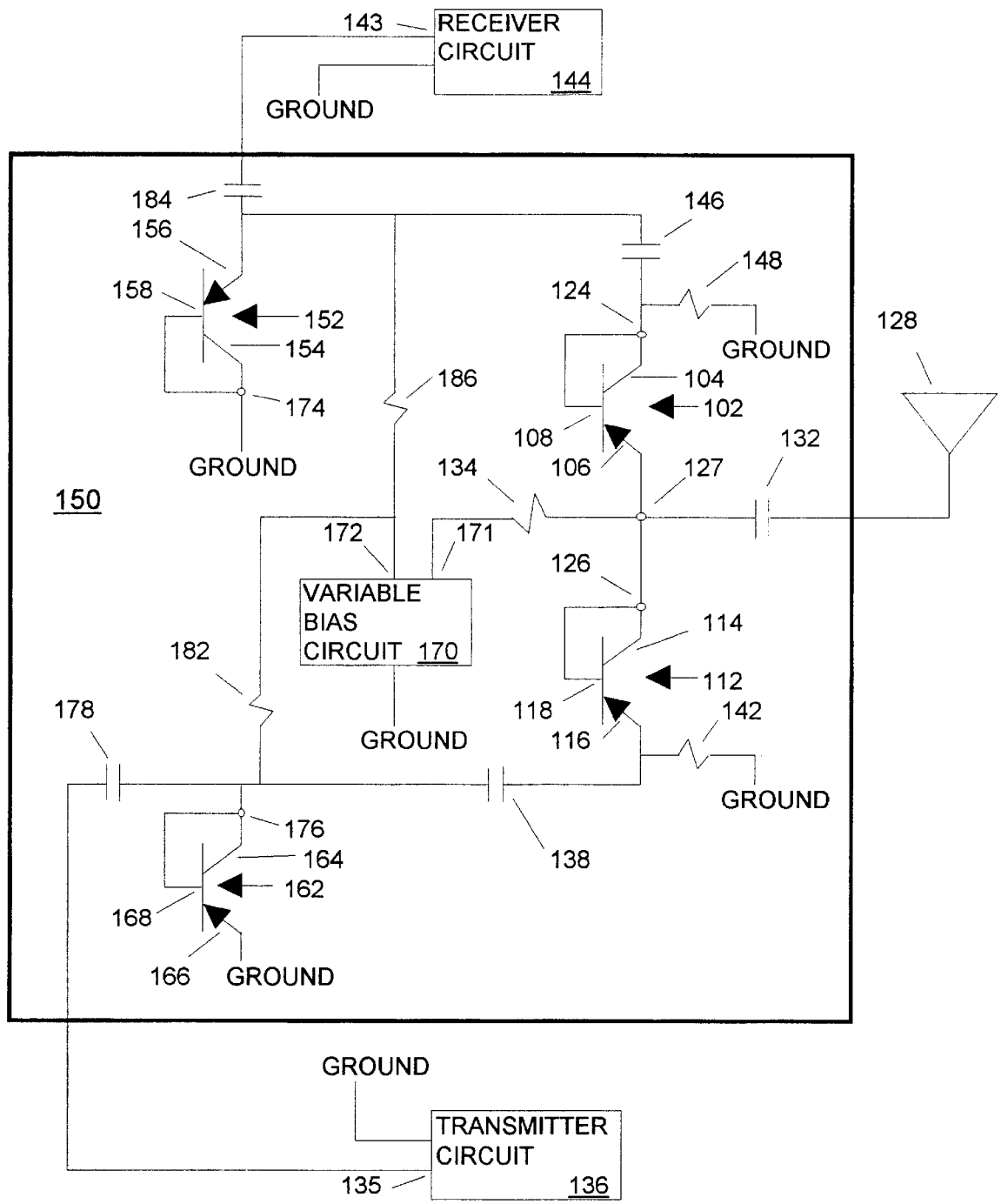

FIG. 4b is a schematic of a radio frequency (RF) transmit/ receive switch of the present invention referred to by the reference numeral 150 and using low frequency lateral PNP transistors such as the lateral PNP transistor 30 (FIG. 2). The RF switch 150 has improved performance as compared to the RF switch 100 at the cost of using more circuitry. In addition to the elements described in the detailed description of FIG. 4a, the RF switch 150 includes a third lateral PNP transistor 152 having a collector 154, an emitter 156, and a base 158; and a fourth lateral PNP transistor 162 having a collector 164, an emitter 166, and a base 168. The collectors 154 and 164 and the emitters 156 and 166 each have a P+ region having a high positive carrier density and the bases 158 and 168 each have an N+ region having a high negative carrier density and an N region such as the N-region 36 (FIG. 2) having a current dependent stored charge.

A variable bias circuit 170 having a non-inverted output 171 and an inverted output 172 replaces the bias circuit 122. The third and fourth transistors 152 and 162 are used as diodes by connecting the collector 154 to the base 158 at a third junction 174 and the collector 164 to the base 168 at a fourth junction 176. The emitter 166, the third junction 174, and a return for the bias circuit 170 are connected to ground. The capacitor 138 connects through a capacitor 178 to the active port 135 of the transmitter circuit 136, to the fourth junction 176, and through a resistor 182 to the inverted output 172 of the bias circuit 170. The capacitor 146 connects through a capacitor 184 to the active port 143 of the receiver circuit 144, to the emitter 156, and through a resistor 186 to the inverted output 172 of the bias circuit 170. In transmit operation a negative potential from the non-inverted output 171 drives a forward bias current through the second transistor 112 and reverse biases the first transistor 102 while the positive potential from the inverted output 172 drives a forward bias current through the third transistor 152 and reverse biases the fourth transistor 162. The third transistor 152 provides additional isolation for the receiver circuit 144 by shunting an RF transmit signal that couples through the reversed biased first transistor 102. In receive operation a positive potential from the non-inverted output 171 drives a forward bias current through the first transistor 102 and reverse biases the second transistor 112 while a negative potential from the inverted output 172 drives a forward bias current through the fourth transistor 162 and reverse biases the third transistor 152. The fourth transistor 162 provides additional isolation to isolate the receiver circuit 144 and the antenna 128 from the output impedance of the transmitter circuit 136.

Figure 5A:
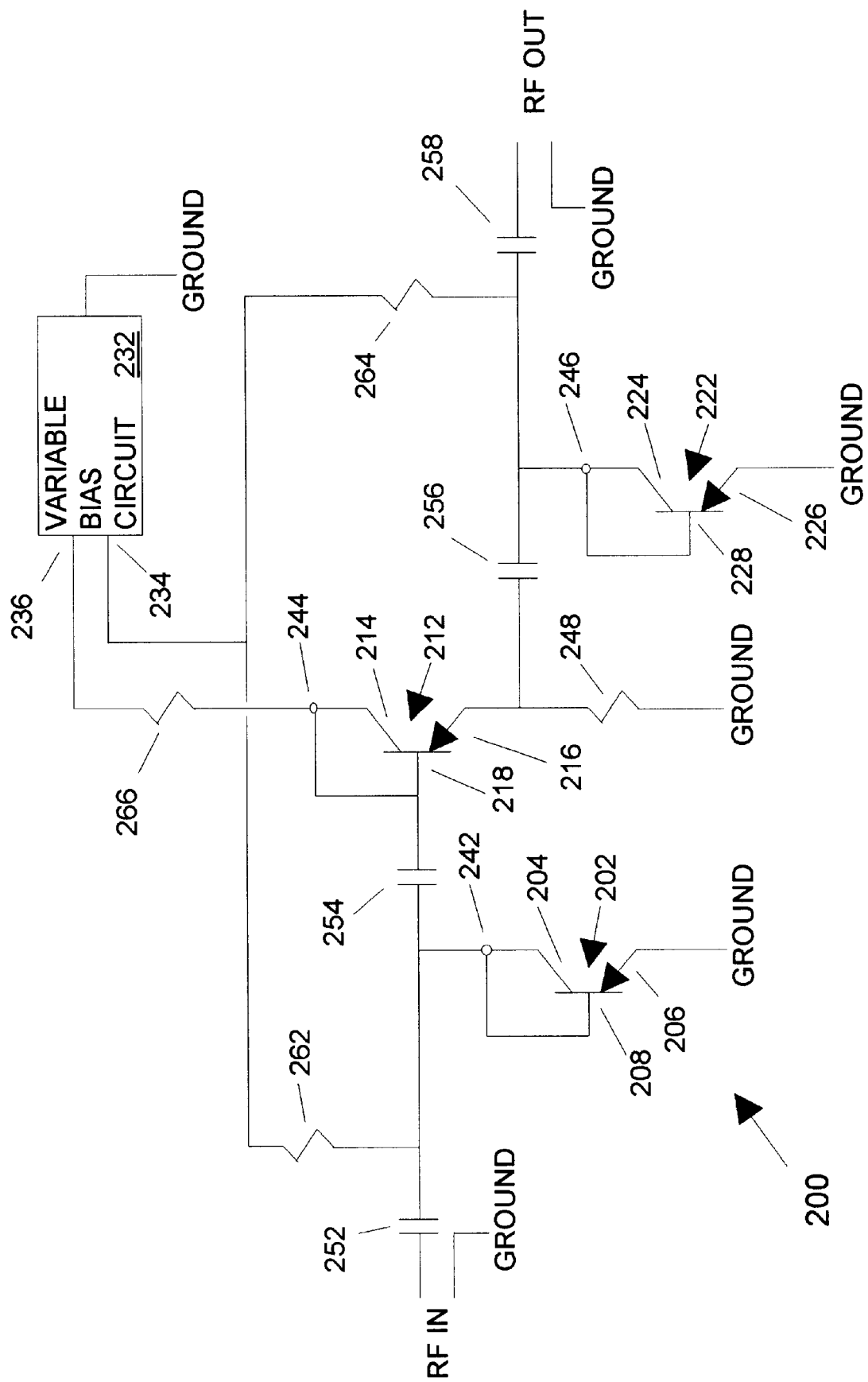
FIGS. 5a and 5b are schematic diagrams of embodiments of an attenuator of the present invention using the lateral PNP transistor of FIG. 2.

FIG. 5a is a schematic of a PI-attenuator of the present invention referred to by the reference numeral 200 and using low frequency lateral PNP transistors such as the lateral PNP transistor 30 (FIG. 2). The PI-attenuator 200 includes a first lateral PNP transistor 202 having a collector 204, an emitter 206, and a base 208; a second lateral PNP transistor 212 having a collector 214, an emitter 216, and a base 218; a third lateral PNP transistor 222 having a collector 224, an emitter 226, and a base 228; and a variable bias circuit 232 connected to ground and having first and second active outputs 234 and 236. The collectors 204, 214, and 224 and the emitters 206, 216, and 226 each have a P+ region having a high positive carrier density and the bases 208, 218, and 228 each have an N+ region having a high negative carrier density and an N region such as the N-region 36 (FIG. 2) having a current dependent stored charge.

The first, second, and third transistors 202, 212, and 222 are used as diodes by connecting the collector 204 to the base 208 at a first junction 242, the collector 214 to the base 218 at a second junction 244, and the collector 224 to the base 228 at a third junction 246, respectively. The emitters 206 and 226 are connected to ground and the emitter 216 is connected to ground through a resistor 248.

The PI-attenuator 200 receives a radio frequency (RF) input signal between an active input and a ground input. The active RF input signal passes through a capacitor 252 to the first junction 242 and then through a capacitor 254 to the second junction 244. From the second junction 244 the RF signal passes through the second transistor 212 and through a capacitor 256 to the third junction 246. From the third junction 246 the RF signal passes through a capacitor 258 to an active RF output. The RF output signal is then issued between the active RF output and ground. In operation the first output 234 of the bias circuit 232 applies a first controllable negative bias voltage through resistors 262 and 264 in parallel to pull first and third forward bias currents through the first and third transistors 202 and 222, respectively, from ground. A first effective RF resistance of the first transistor 202 from the first junction 242 to ground is controlled by the first bias current and a third effective RF resistance of the third transistor 222 from the third junction 246 to ground is controlled by the third bias current. Typically, the resistor 262 and the resistor 264 have the same resistance so the first RF resistance and the third RF resistance are approximately equal. The second output 236 applies a second controllable negative bias voltage to pull a second forward bias current through the resistors 248 and 266 and the second transistor 212 in series from ground. A second effective RF resistance for the second transistor 212 from the second junction 244 to the emitter 216 is controlled by the second bias current. The first and second bias voltages may be controlled independently to control the attenuation of the PI-attenuator 200 and match the input and output impedance of the PI-attenuator 200 to the impedance of the circuits driving RF input signal and receiving the RF output signal. Alternatively, the input and output impedances of the PI-attenuator 200 can be set independently by applying independent bias voltages to the resistors 262 and 264 or using resistors of different resistance values.

Figure 5B:
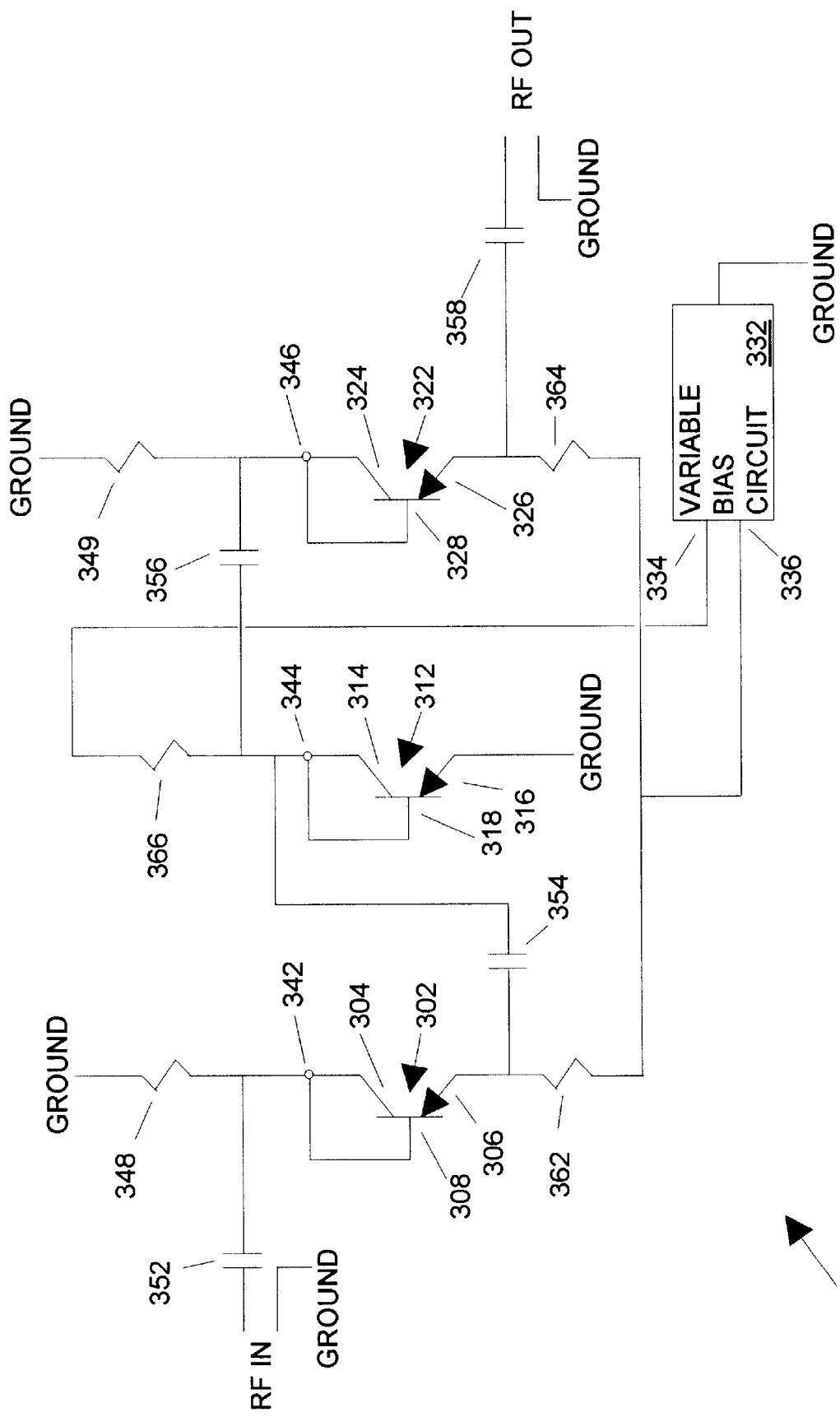

FIG. 5b is a schematic of a T-attenuator of the present invention referred to by the reference numeral 300 and using low frequency lateral PNP transistors such as the lateral PNP transistor 30 (FIG. 2). The T-attenuator 300 includes a first lateral PNP transistor 302 having a collector 304, an emitter 306, and a base 308; a second lateral PNP transistor 312 having a collector 314, an emitter 316, and a base 318; a third lateral PNP transistor 322 having a collector 324, an emitter 326, and a base 328; and a variable bias circuit 332 connected to ground and having first and second active outputs 334 and 336. The collectors 304, 314, and 324 and the emitters 306, 316, and 326 each have a P+ region having a high positive carrier density and the bases 308, 318, and 328 each have an N+ region having a high negative carrier density and an N region such as the N-region 36 (FIG. 2) having a current dependent stored charge.

The first, second, and third transistors 302, 312, and 322 are used as diodes by connecting the collector 304 to the base 308 at a first junction 342, the collector 314 to the base 318 at a second junction 344, and the collector 324 to the base 328 at a third junction 346, respectively. The emitter 316 is connected to ground and the first and third junctions 342 and 346 are connected to ground through resistors 348 and 349, respectively.

The T-attenuator 300 receives a radio frequency (RF) input signal between an active input and a ground input. The active RF input signal passes through a capacitor 352 to the first junction 342 and then through the first transistor 302 and a capacitor 354 to the second junction 344. From the second junction 344 the RF signal passes through and a capacitor 356 to the third junction 346. From the third junction 346 the RF signal passes through the third transistor 322 and a capacitor 358 to an active RF output. The RF output signal is then issued between the active RF output and ground. In operation the first output 336 of the bias circuit 332 applies a controllable positive bias voltage through a resistor 362, the first transistor 302, and the resistor 348 in series to drive a first forward bias current through the first transistor 302; and in parallel through a resistor 364, the third transistor 322, and the resistor 349 in series to drive a third forward bias current through the third transistor 322. A first effective RF resistance of the first transistor 302 from the first junction 342 to the second junction 344 is controlled by the first bias current and an effective third RF resistance of the third transistor 322 from the third junction 346 to the RF output is controlled by the third bias current. Typically, the sum of the resistances of the resistors 348 and 362 equals the sum of the resistances of the resistors 349 and 364 so the first RF resistance and the third RF resistance are approximately equal. The second output 334 applies a controllable negative bias voltage to drive a second forward bias current through a resistor 366 and the second transistor 312 in series to ground. A second effective RF resistance for the second transistor 312 from the second junction 344 to the emitter 316 is controlled by the second bias current. The first and second bias voltages may be controlled independently to control the attenuation of the T-attenuator 300 and match the input and output impedance of the T-attenuator 300 to the impedance of the circuits driving RF input signal and receiving the RF output signal. Alternatively, the input and output impedances of the T-attenuator 300 can be set independently by applying independent bias voltages to the resistors 362 and 364 or using resistors of different resistance values.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for switching a radio frequency (RF) signal in an RF integrated circuit having low frequency lateral PNP transistors, each of said lateral transistors including a collector having a P+ region, an emitter having a P+ region, a base having an N+ region and an N region having a current dependent stored charge, comprising steps of:

connecting a collector of a first one of said lateral transistors to a base of said first one of said lateral transistors at a first junction;

coupling one of (i) said first junction and (ii) an emitter of said first one of said lateral transistors to a first circuit port;

coupling the other of (i) said first junction and (ii) said emitter of said first one of said lateral transistors to an output junction;

alternatively providing a first bias state for driving a forward current into said emitter of said first one of said lateral transistors and out of said first junction for enabling an RF signal to pass between said output junction and said first circuit port; or providing a second bias state for applying a negative voltage from said emitter of said first one of said lateral transistors to said first junction for inhibiting an RF signal from passing between said output junction and said first circuit port.

2. The method of claim 1, further including steps of:

connecting a collector of a second one of said lateral transistors to a base of said second one of said lateral transistors at a second junction;

coupling one of (i) said second junction and (ii) an emitter of said second one of said lateral transistors to a second circuit port;

coupling the other of (i) said second junction and (ii) said emitter of said second one of said lateral transistors to said output junction; and wherein:

the step of providing said first bias state is further for applying a negative voltage from said emitter of said second one of said lateral transistors to said second junction for inhibiting an RF signal from passing between said output junction and said second circuit port; and the step of providing said second bias state is further for driving a forward current into said emitter of said second one of said lateral transistors and out of said second junction for enabling an RF signal to pass from said output junction to said second circuit port.

3. The method of claim 2, further including steps of:

connecting a collector of a third one of said lateral transistors to a base of said third one of said lateral transistors at a third junction;

coupling a one of (i) said third junction and (ii) an emitter of said third one of said lateral transistors to said first circuit port;

coupling the other of (i) said third junction and (ii) said emitter of said third one of said lateral transistors to ground; and wherein:

the step of providing said first bias state is further for applying a negative voltage from said emitter of said third one of said lateral transistors to said third junction for inhibiting an RF signal from passing between said first circuit port and ground; and the step of providing said second bias state is further for driving a forward current into said emitter of said third one of said lateral transistors and out of said third junction for shunting an RF signal from said first circuit port to ground.

4. A radio frequency (RF) switch in an RF integrated circuit, comprising:

a lateral transistor including an emitter having a P+ region, a collector having a P+ region, a base having an N+ region and an N region having a current dependent stored charge; said collector and said base connected at a first junction;

one of (i) said emitter and (ii) said first junction coupled to a first circuit port and the other of (i) said emitter and (ii) said first junction connected to an output junction; and a bias circuit having a first bias state and a second bias state, said first bias state for driving a forward current into said emitter and out of said first junction for enabling an RF signal to pass between said output junction and said first circuit port, and said second bias state for applying a negative voltage from said emitter to said first junction for inhibiting an RF signal from passing between said output junction and said first circuit port.

5. The switch of claim 4, further including:

a second lateral transistor including an emitter having a P+ region, a collector having a P+ region, a base having an N+ region and an N region having a current dependent stored charge; said second transistor collector and said second transistor base connected at a second junction;

one of (i) said second transistor emitter and (ii) said second junction connected to a second circuit port and the other of (i) said second transistor emitter and (ii) said second junction connected to said output junction; and wherein:

said first bias state is further for applying a negative voltage from said second transistor emitter to said second junction for inhibiting an RF signal from passing between said output junction and said second circuit port, and said second bias state is further for driving a forward current into said second transistor emitter and out of said second junction for enabling an RF signal to pass from said output junction to said second circuit port.

6. The switch of claim 5, further including:

a third lateral transistor including an emitter having a P+ region, a collector having a P+ region, a base having an N+ region and an N region having current dependent stored charge, said third transistor collector and said third transistor base connected at a third junction;

one of (i) said third transistor emitter and (ii) said third junction connected to said first circuit port and the other of (i) said third transistor emitter and (ii) said third junction connected to ground; and wherein:

said first bias state is further for applying a negative voltage from said third transistor emitter to said third junction for inhibiting an RF signal from passing between said first circuit port and ground, and said second state is further for driving a forward current into said third transistor emitter and out of said third junction for shunting an RF signal from said first circuit port to ground.

7. A method for attenuating a radio frequency (RF) signal in an RF integrated circuit including low frequency lateral PNP transistors, each of said lateral transistors having a collector having a P+ region, an emitter having a P+ region, a base having an N+ region and an N region having a current dependent stored charge, comprising steps of:

connecting a collector of a first one of said lateral transistors to a base of said first one of said lateral transistors at a first junction;

coupling an emitter of said first one of said lateral transistors and said first junction in shunt across said RF signal;

applying a variable first forward bias current into said emitter of said first one of said lateral transistors and out of said first junction;

controlling a first stored charge according to said first current;

controlling a first RF resistance between said emitter of said first one of said lateral transistors and said first junction according to said first stored charge; and variably attenuating said RF signal according to said first RF resistance.

8. The method of claim 7, further including steps of:

connecting a collector of a second one of said lateral transistors to a base of said second one of said lateral transistors at a second junction;

coupling an emitter of said second one of said lateral transistors and said second junction in series with said RF signal;

applying a second variable forward bias across said emitter of said second one of said lateral transistors and said second junction;

controlling a second stored charge according to said second current;

controlling a second RF resistance between said emitter of said second one of said lateral transistors and said second junction according to said second stored charge; and further variably attenuating said RF signal according to said second RF resistance.

9. A radio frequency (RF) variable attenuator in an RF integrated circuit, comprising:

a lateral transistor including an emitter having a P+ region, a collector having a P+ region, a base having an N+ region and an N region having a current dependent stored charge, said collector and said base connected at a first junction; said emitter and said first junction coupled for shunting an RF signal; and a variable bias circuit for applying a variable forward current into said emitter and out of said first junction, said current controlling said stored charge for controlling an RF resistance between said emitter and said first junction for variably attenuating said RF signal according to said current.

10. The attenuator of claim 9, further including:

a second lateral transistor including an emitter having a P+ region, a collector having a P+ region, a base having an N+ region and an N-region having a second current dependent stored charge, said second transistor collector and said second transistor base connected at a second junction, said second transistor emitter and said second junction connected in series with said RF signal; and wherein:

the variable bias circuit is further for applying a second variable forward bias current into said second transistor emitter and out of said second junction, said second current controlling said second stored charge for controlling a second RF resistance between said second transistor emitter and said second junction for further variably attenuating said RF signal according to said second current.

11. A method for providing a variable radio frequency (RF) resistance in an RF integrated circuit having lateral PNP transistors, each said lateral transistor having an emitter having a P+ region, a collector having a P+ region, a base having an N+ region and an N region having a current dependent stored charge, comprising steps of:

connecting a collector of a first one of said lateral transistors and a base of said first one of said lateral transistors at a junction; and connecting a variable bias circuit for driving a variable forward bias current into an emitter of said first one of said lateral transistors and out of said junction for alternatively increasing and decreasing said stored charge for responsively decreasing and increasing, respectively, said RF resistance between said emitter and said junction.

12. A radio frequency (RF) integrated circuit having an RF resistor having a variable resistance, comprising:

a lateral PNP transistor including an emitter having a P+ region, a collector having a P+ region, a base having an N+ region and an N region having a current dependent stored charge, said collector and said base connected at a junction; and a variable bias circuit for driving a variable forward bias current into said emitter and out of said junction, for alternatively increasing and decreasing said stored charge for responsively decreasing and increasing, respectively, said RF resistance between said emitter and said junction.

* * * * *